(12) United States Patent
Gong

(10) Patent No.: US 12,127,389 B2
(45) Date of Patent: Oct. 22, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Jinfeng Gong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 428 days.

(21) Appl. No.: 17/456,850

(22) Filed: Nov. 29, 2021

(65) Prior Publication Data

US 2022/0223597 A1 Jul. 14, 2022

Related U.S. Application Data

(63) Continuation of application No. PCT/CN2021/107898, filed on Jul. 22, 2021.

(30) Foreign Application Priority Data

Jan. 14, 2021 (CN) .......................... 202110049125.3

(51) Int. Cl.
H10B 12/00 (2023.01)

(52) U.S. Cl.
CPC ............. H10B 12/30 (2023.02); H10B 12/03 (2023.02); H10B 12/482 (2023.02)

(58) Field of Classification Search
CPC .... H10B 12/03; H10B 12/0335; H10B 12/30; H10B 12/482
See application file for complete search history.

(56) References Cited

U.S. PATENT DOCUMENTS

| 6,194,309 B1 * | 2/2001 | Jin ...................... H01L 23/5226 |
| | | 438/533 |
| 8,796,090 B2 | 8/2014 | Cho et al. |
| 9,111,953 B2 | 8/2015 | Park |

(Continued)

FOREIGN PATENT DOCUMENTS

| CN | 1992163 A | 7/2007 |
| CN | 102569426 A | 7/2012 |

(Continued)

OTHER PUBLICATIONS

Notice of Allowance of the Chinese application No. 202110049125.3, issued on May 10, 2022.

(Continued)

*Primary Examiner* — Michelle Mandala
*Assistant Examiner* — Kevin Quinto
(74) *Attorney, Agent, or Firm* — Syncoda LLC; Feng Ma

(57) ABSTRACT

A semiconductor structure manufacturing method includes: providing a substrate, the substrate having a plurality of discrete bit lines, and a capacitor contact hole being provided between adjacent bit lines; forming a fill film, the fill film being provided with a gap region; etching the fill film by using a first etch process to open the gap region, the remaining fill film acting as a first fill layer; sequentially stacking at least two base fill layers on a surface of the first fill layer, the base fill layer farthest from the substrate filling the remaining capacitor contact hole; decreasing a doping concentration of the base fill layer, layer by layer and etching the first fill layer and at least part of the base fill layers by using a second etch.

13 Claims, 7 Drawing Sheets

(56) References Cited

U.S. PATENT DOCUMENTS

| | | |
|---|---|---|
| 9,293,362 B2 | 3/2016 | Lee et al. |
| 10,978,457 B2 | 4/2021 | Feng et al. |
| 2013/0277802 A1 | 10/2013 | Park et al. |
| 2014/0011334 A1 | 1/2014 | Cho et al. |
| 2014/0175659 A1 | 6/2014 | Lee et al. |
| 2016/0172304 A1 | 6/2016 | Lee et al. |
| 2019/0097007 A1* | 3/2019 | Ahn .................... H01L 29/4011 |
| 2020/0111795 A1 | 4/2020 | Feng et al. |

FOREIGN PATENT DOCUMENTS

| | | |
|---|---|---|
| CN | 103531479 A | 1/2014 |
| CN | 103903994 A | 7/2014 |
| CN | 108933136 A | 12/2018 |
| CN | 109860178 A | 6/2019 |
| CN | 110600371 A | 12/2019 |
| CN | 110718532 A | 1/2020 |
| CN | 111106095 A | 5/2020 |
| CN | 211788963 U | 10/2020 |
| CN | 112864097 A | 5/2021 |
| GB | 2298313 A | 8/1996 |
| KR | 20070098319 A | 10/2007 |
| KR | 20080085557 A | 9/2008 |
| KR | 20110060738 A | 6/2011 |
| TW | 416143 B | 12/2000 |

OTHER PUBLICATIONS

International Search Report (ISR) in international application No. PCT/CN2021/107898 mailed on Sep. 8, 2021.

* cited by examiner

SEMICONDUCTOR STRUCTURE AND MANUFACTURING METHOD THEREOF

CROSS-REFERENCE TO RELATED APPLICATIONS

This is a continuation of International Patent Application No. PCT/CN2021/107898 filed on Jul. 22, 2021, which claims priority to Chinese Patent Application No. 202110049125.3 filed on Jan. 14, 2021. The disclosures of the above-referenced applications are hereby incorporated by reference in their entirety.

BACKGROUND

With the continuous miniaturization of a Dynamic Random-Access Memory (DRAM) process, a distance between adjacent bit line structures becomes increasingly small. The increasingly small distance between the adjacent bit line structures may lead to a large aspect ratio of a capacitor contact hole between the adjacent bit line structures.

SUMMARY

Embodiments of the present disclosure relate to the field of semiconductors, and in particular, to a semiconductor structure and a manufacturing method thereof.

Various embodiments of the present disclosure provide a semiconductor structure and a manufacturing method thereof, which are conducive to the formation of a capacitor contact plug with a relatively flat top morphology in the case of a capacitor contact hole with a larger aspect ratio, so as to help improve a yield of the semiconductor structure.

Some embodiments of the present disclosure provide a semiconductor structure manufacturing method, including: providing a substrate, the substrate having a plurality of discrete bit lines, and a capacitor contact hole being provided between adjacent bit lines; forming a fill film filling the capacitor contact hole, the fill film being provided with a gap region; etching the fill film by using a first etch process to open the gap region, the remaining fill film acting as a first fill layer, the remaining gap region acting as a first gap located in the first fill layer, the first fill layer having a top surface connecting the first gap and a sidewall of the capacitor contact hole, and in a direction parallel to the substrate and pointing to the sidewall of the capacitor contact hole along the first gap, a distance between the top surface and the substrate gradually increasing; sequentially stacking at least two base fill layers on a surface of the first fill layer, the base fill layer farthest from the substrate filling the remaining capacitor contact hole; decreasing a doping concentration of the base fill layer, layer by layer, in a direction perpendicular to the substrate and pointing to the bit line along the substrate; and etching the first fill layer and at least part of the base fill layers by using a second etch process to form a capacitor contact plug.

Correspondingly, the embodiments of the present disclosure further provide a semiconductor structure, including: a substrate, the substrate having a plurality of discrete bit lines, and a capacitor contact hole being provided between adjacent bit lines; and a capacitor contact plug, the capacitor contact plug being located at a bottom of the capacitor contact hole, and the capacitor contact plug being composed of a first fill layer or the capacitor contact plug being composed of a first fill layer and a base fill layer.

BRIEF DESCRIPTION OF THE DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DETAILED DESCRIPTION

Figure 1:
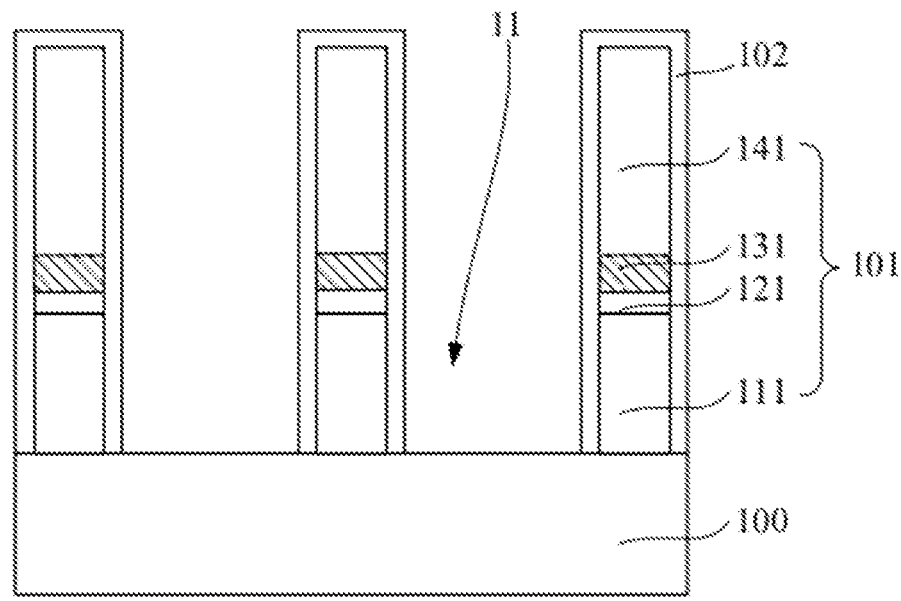
FIG. 1 is a first schematic diagram of cross-sectional structures corresponding to steps of a semiconductor structure manufacturing method according to a first embodiment of the present disclosure.

During subsequent formation of a capacitor contact plug in the capacitor contact hole, it may be difficult to control a top morphology of the capacitor contact plug, and consequently it may be difficult to ensure that a semiconductor structure has a better yield.

Various embodiments of the present disclosure can address how to form a capacitor contact plug with a better top morphology in the case of a capacitor contact hole with a larger aspect ratio is an urgent problem to be solved currently.

Some embodiments of the present application can form a capacitor contact plug with a better top morphology in the case of a capacitor contact hole with a larger aspect ratio.

According to analysis, in order to satisfy the miniaturization of a DRAM, a distance between adjacent bit lines becomes increasingly small, and the aspect ratio of the capacitor contact hole becomes increasingly large. Therefore, when the capacitor contact hole is filled with a conductive material to form a fill layer, a top of the capacitor contact hole between the adjacent bit lines may be sealed by the conductive material in advance. The fill layer may have a void, and a surface of the fill layer located above the capacitor contact hole has a groove. Due to the void and the groove, a capacitor contact plug with a relatively flat top morphology cannot be formed when the fill layer is subsequently etched to form the capacitor contact plug, which cannot ensure small contact resistance between the capacitor contact plug and other conductive structures.

In order to solve the above problem, an embodiment of the present disclosure provides a semiconductor structure manufacturing method, in which, firstly, a fill film is formed in a capacitor contact hole and the fill film is etched by using a first etch process to form a first fill layer, and then at least two base fill layers are formed on a surface of the first fill layer. The first fill layer is provided with a first gap, the first fill layer has a top surface connecting the first gap and a sidewall of the capacitor contact hole, and in a direction parallel to a substrate and pointing to the sidewall of the capacitor contact hole along the first gap, a distance between the top surface and the substrate gradually increases; on this basis, the base fill layer close to the sidewall of the capacitor contact hole is subsequently etched by a second etch process at a first etch rate, and the base fill layer in a middle region of the capacitor contact hole is etched by the second etch process at a second etch rate. In a direction perpendicular to the substrate and pointing to the bit line along the substrate, the doping concentration of the base fill layer is decreased layer by layer, so the first etch rate is greater than the second etch rate. Therefore, the capacitor contact plug finally formed can have a relatively flat top morphology by controlling a difference in doping concentrations between adjacent base fill layers, which helps reduce contact resistance between the capacitor contact plug and other conductive structures and helps improve the yield of a semiconductor structure.

In order to make the objectives, technical solutions and advantages of the embodiments of the present disclosure clearer, various embodiments of the present disclosure will be described below in detail with reference to the drawings. However, those of ordinary skill in the art may understand that, in the embodiments of the present disclosure, numerous technical details are set forth in order to enable a reader to better understand the present disclosure. However, the technical solutions claimed in the present disclosure can be implemented without these technical details and various changes and modifications based on the embodiments below.

FIG. 1 to FIG. 9 are schematic diagrams of cross-sectional structures corresponding to steps of a semiconductor structure manufacturing method according to a first embodiment of the present disclosure.

Referring to FIG. 1, a substrate 100 is provided. The substrate 100 has a plurality of discrete bit lines 101, and a capacitor contact hole 11 is provided between adjacent bit lines 101. In this embodiment, the substrate 100 includes structures such as an embedded word line, a shallow trench isolation structure and an active region. The bit line 101 includes a bit line contact layer 111, a bottom dielectric layer 121, a metal layer 131 and a top dielectric layer 141 sequentially stacked. The bit line contact layer 111 is made of tungsten or polysilicon. The bottom dielectric layer 121 and the top dielectric layer 141 are made of silicon nitride, silicon dioxide, or silicon oxynitride. The metal layer 131 may be made of one or more conductive materials, such as doped polysilicon, titanium, titanium nitride, tungsten and a tungsten composite.

In addition, a top and a sidewall of the bit line 101 are further covered with an insulation layer 102. The insulation layer 102 is configured to protect and isolate the adjacent bit lines 101. Specifically, the insulation layer 102 is formed by an atomic layer deposition process. The atomic layer deposition process has the characteristics of a slow deposition rate, high density and good step coverage of a film layer deposited, and so on. In this way, the insulation layer 102, when being thinner, can effectively isolate and protect the adjacent bit lines 101, which prevents the occupation of a larger space between the adjacent bit lines 101 by the isolation layer 102 and facilitates subsequent filling of a base fill layer. The insulation layer 102 is made of silicon nitride or silicon oxynitride.

In other embodiments, in a subsequent process step, the insulation layer 102 located at the top of the bit line 101 may be removed.

Figure 2:
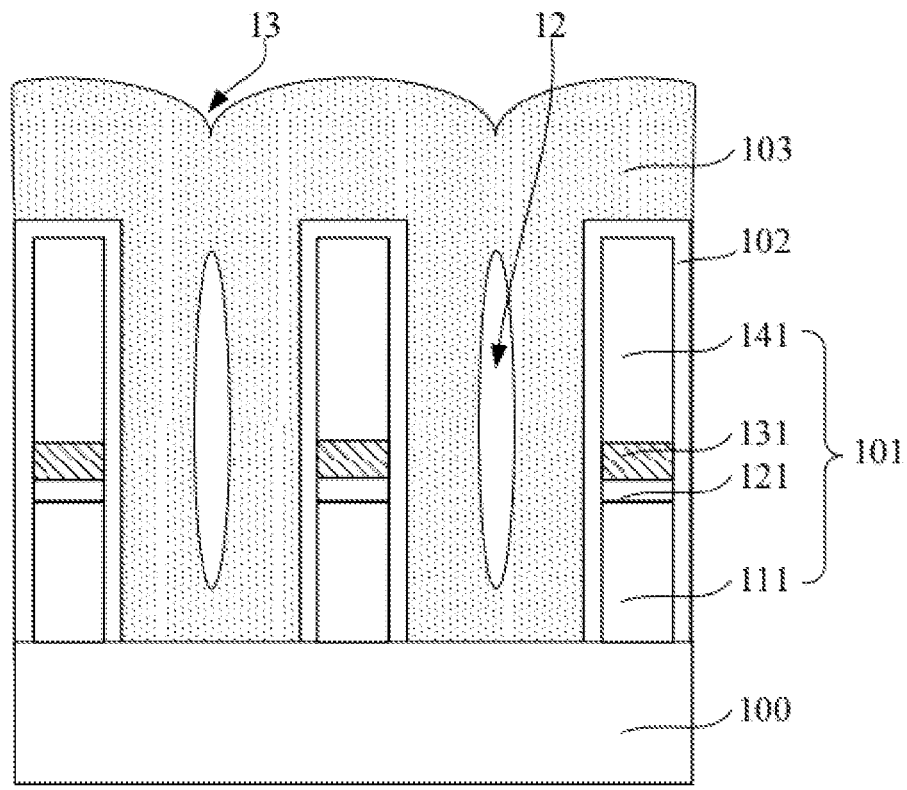
FIG. 2 is a second schematic diagram of cross-sectional structures corresponding to steps of the semiconductor structure manufacturing method according to the first embodiment of the present disclosure.

Referring to FIG. 2, a fill film 103 filling the capacitor contact hole 11 (refer to FIG. 1) is formed, and the fill film 103 is provided with a gap region 12.

In this embodiment, the fill film 103 is formed by a process of chemical vapor deposition or atomic layer deposition, and the fill film 103 not only fills the capacitor contact hole 11 but also is located at the top of the bit line 101. Specifically, due to the continuous miniaturization of the process, in a direction perpendicular to a surface of the substrate 100, a distance between the adjacent bit lines 101 tends to be smaller in the case of a constant height of the bit line 101, and then an aspect ratio of the capacitor contact hole 11 tends to be larger; so the fill film 103 easily has the gap region 12, and a surface of the fill film 103 located above the capacitor contact hole 11 has a first groove 13. Further, a top of the fill film 103 is higher than that of the bit line 101.

Further, the top of the fill film 103 to be formed is required to be higher than that of the bit line 101, and then the fill film 103 is thicker in the direction perpendicular to the surface of the substrate 100; therefore, the fill film 103 formed by chemical vapor deposition with a higher deposition rate can shorten a cycle of a semiconductor structure manufacturing process.

Specifically, the fill film 103 is a silicon material layer with a doping element. The silicon material layer is made of monocrystalline silicon, polysilicon or amorphous silicon. The doping element is boron or phosphorus. It is to be noted that, in this embodiment, the silicon material layer and the doping element are introduced to enable those skilled in the art to understand the implementation details of the solution, which does not constitute a limitation on the solution. In other embodiments, the fill film 103 may also be a silicon material layer without any doping element. In addition, the fill film 103 may be formed only in the capacitor contact hole 11 and is not required to cover the top of the bit line 101.

Further, a doping concentration of the doping element in the fill film 103 is greater than that of the doping element in a subsequently-formed base fill layer. When the fill film 103 is formed by using a deposition process, during the deposition, a gas with the doping element is introduced, and a gas flow of the gas configured to form the fill film 103 is a first gas flow; when the base fill layer is formed subsequently by using the deposition process, a gas with the doping element is introduced, and a gas flow of the gas configured to form the base fill layer is a second gas flow. The first gas flow is greater than the second gas flow.

In this embodiment, during the formation of the fill film 103, the gas flow of the gas with the doping element is fixed. In other embodiments, during the formation of the fill film 103, the gas flow of the gas with the doping element may gradually increase with the deposition time. In addition, during the formation of the fill film 103, a minimum gas flow of the gas is a third gas flow. During the subsequent formation of the base fill layer, a maximum gas flow of the gas with the doping element is a fourth gas flow, and the third gas flow is greater than the fourth gas flow.

Figure 3:
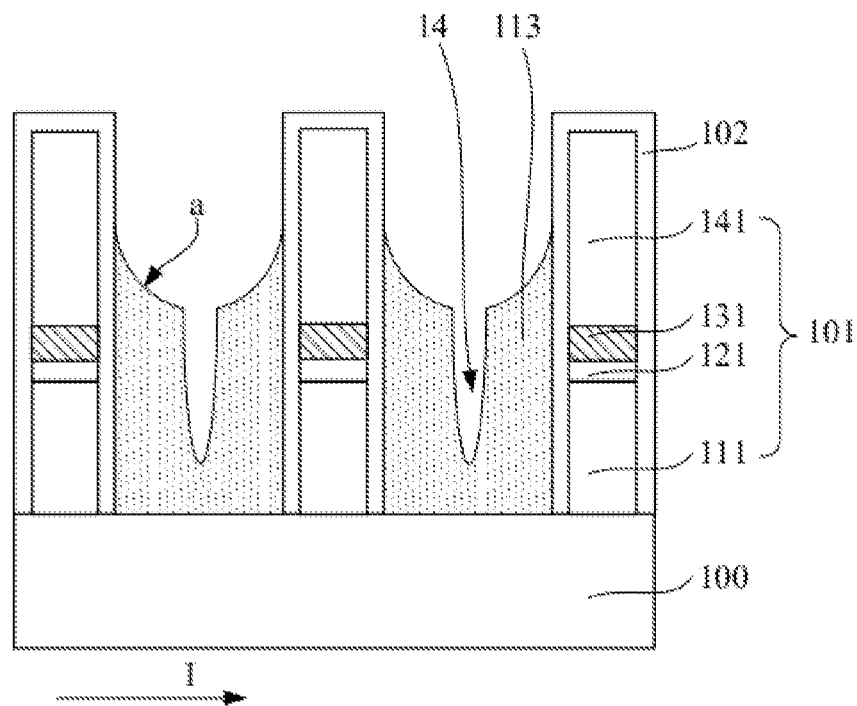
FIG. 3 is a third schematic diagram of cross-sectional structures corresponding to steps of the semiconductor structure manufacturing method according to the first embodiment of the present disclosure.

Referring to FIG. 3, the fill film 103 (FIG. 2) is etched by using a first etch process to open the gap region 12 (refer to FIG. 2), the remaining fill film 103 acts as a first fill layer 113, the remaining gap region 12 acts as a first gap 14 located in the first fill layer 113, and the first fill layer 113 has a top surface a connecting the first gap 14 and a sidewall of the capacitor contact hole 11 (refer to FIG. 1).

As can be seen from the above description, the fill film 103 has a gap region 12, and a surface of the fill film 103 located above the capacitor contact hole 11 has a first groove 13. When the fill film 103 is etched by using a first etch process to form the first fill layer 113, a distance between the top surface a of the first fill layer 113 and the substrate 100 gradually increases in a direction parallel to the substrate 100 and pointing to the sidewall of the capacitor contact hole 11 along the first gap 14.

In this embodiment, the first fill layer 113 is located only at a bottom and a partial sidewall of the capacitor contact hole 11, which helps ensure a larger size of an opening of the first gap 14 away from the substrate 100. Further, in a direction I perpendicular to the sidewall of the capacitor contact hole 11, a width of the opening of the first gap 14 away from the substrate 100 may be a maximum width of the gap region 12; that is, the gap region 12 is opened to a larger extent by the first etch process, which helps the subsequent filling of the first gap 14 with the base fill layer, and the base fill layer located in the first gap 14 has no void, which helps ensure that the subsequently-formed capacitor contact plug has no void, so as to ensure good conductivity of the capacitor contact plug.

Since the fill film 103 is a silicon material layer with a doping element, the first fill layer 113 is also a silicon material layer with a doping element, and a doping concentration of the doping element in the first fill layer 113 is greater than that of the doping element in the subsequently-formed base fill layer. Therefore, when the first fill layer 113 and at least part of the base fill layers are etched subsequently by using a second etch process, in order to obtain a capacitor contact plug with a relatively flat top morphology, with an increase in the etch time, the first fill layer 113 is required to be etched more. When the doping concentration of the doping element in the first fill layer 113 is greater than that of the doping element in the base fill layer, the first fill layer 113 can be etched more than the base fill layer in a same etch time, so it is more conducive to the formation of the capacitor contact plug with the relatively flat top morphology.

Figure 4:
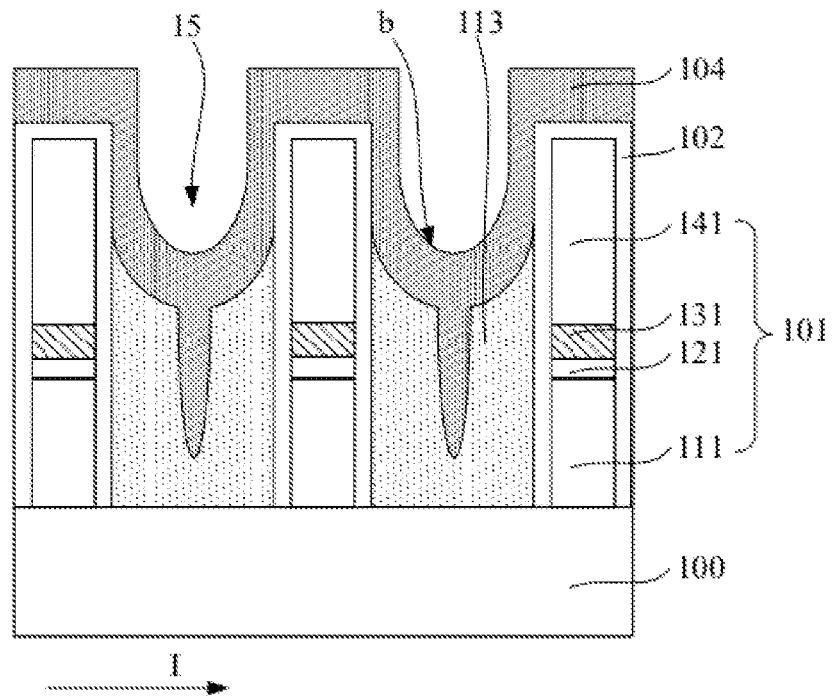
FIG. 4 is a fourth schematic diagram of cross-sectional structures corresponding to steps of the semiconductor structure manufacturing method according to the first embodiment of the present disclosure.
Figure 5:
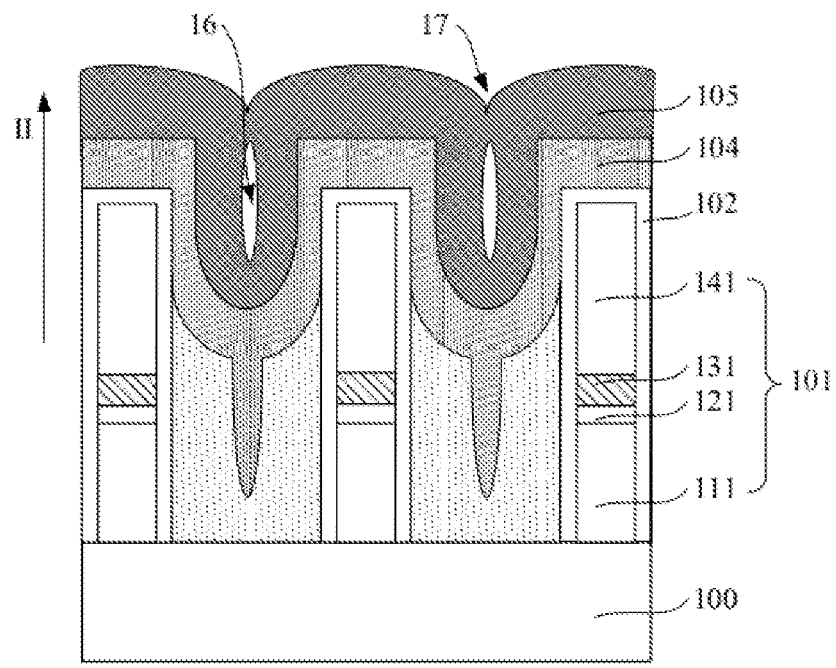
FIG. 5 is a fifth schematic diagram of cross-sectional structures corresponding to steps of the semiconductor structure manufacturing method according to the first embodiment of the present disclosure.

Referring to FIG. 4 and FIG. 5, at least two base fill layers are sequentially stacked on a surface of the first fill layer 113, and the base fill layer farthest from the substrate 100 fills the remaining capacitor contact hole 11; a doping concentration of the base fill layer is decreased layer by layer in a direction II perpendicular to the substrate 100 and pointing to the bit line 101 along the substrate 100. Therefore, the base fill layers are etched subsequently by the second etch process at layer-by-layer decreasing rates in the direction perpendicular to the substrate 100 and pointing to the bit line 101 along the substrate 100.

In this embodiment, the two base fill layers are sequentially stacked on the surface of the first fill layer 113. Specifically, the base fill layer is a silicon material layer with a doping element, and a difference between doping concentrations of the doping elements in adjacent base fill layers is not greater than 200 atom/cm$^3$.

In this embodiment, the process step of sequentially stacking two base fill layers on the surface of the first fill layer 113 is as follows.

Referring to FIG. 4, a bottom fill layer 104 is formed. The bottom fill layer 104 fills the first gap 14 (refer to FIG. 3), and the bottom fill layer 104 located in the capacitor contact hole 11 (refer to FIG. 1) defines a concave hole 15.

Specifically, the bottom fill layer 104 is formed by a process of chemical vapor deposition or atomic layer deposition, and the bottom fill layer 104 is also located above the top of the bit line 101. In the direction I perpendicular to the sidewall of the capacitor contact hole 11, a ratio of a thickness of the bottom fill layer 104 to a width of the capacitor contact hole 11 ranges from 10% to 40%. Preferably, the ratio of the thickness of the bottom fill layer 104 to the width of the capacitor contact hole 11 is 20%. On the one hand, the bottom fill layer 104 with the thickness is easily formed through a deposition process in the case of the capacitor contact hole 11 with a larger aspect ratio. On the other hand, it is conducive to subsequently forming the bottom fill layer 104 with the thickness through a second etch process, so as to form a capacitor contact plug with a relatively flat top morphology.

Referring to FIG. 5, a top fill layer 105 is formed. The top fill layer 105 fills the concave hole 15 (refer to FIG. 4), the top fill layer 105 is provided with a second gap 16, and a second groove 17 is further provided at a position where a surface of the top fill layer 105 corresponds to a central axis of the concave hole 15.

Specifically, the top fill layer 105 may be formed by a same process as the bottom fill layer 104, and the top fill layer 105 is also located above the top of the bit line 101. It is to be noted that, in other embodiments, the bottom top layer 104 and the top fill layer 105 may be formed only in the capacitor contact hole 11 and are not required to cover the top of the bit line 101.

In this embodiment, when the base fill layer is formed by using a deposition process, during the deposition, a gas with the doping element is introduced, and a gas flow of the gas configured to form the base fill layer is decreased layer by layer in a direction perpendicular to the substrate 100 and pointing to the bit line 101 along the substrate 100.

Specifically, a gas flow of the gas configured to form the bottom fill layer 104 is greater than that of the gas configured to form the top fill layer 105, and a gas flow of the gas configured to form the fill film 103 is greater than that of the gas configured to form the bottom fill layer 104. The doping concentration of the doping element in the first fill layer 113, the doping concentration of the doping element in the bottom fill layer 104 and the doping concentration of the doping element in the top fill layer 105 are sequentially decreased, so the first fill layer 113, the bottom fill layer 104 and the top fill layer 105 are subsequently etched by the second etch process at sequentially decreasing rates.

In this embodiment, referring to FIG. 3 to FIG. 5, in the direction parallel to the substrate 100 and pointing to the sidewall of the capacitor contact hole 11 along the first gap 14, since the distance between the top surface a of the first fill layer 113 and the substrate 100 gradually increases, a distance between a top surface b of the bottom fill layer 104 located on the top surface a of the first fill layer 113 and the substrate 100 also gradually increases. When the second etch process is performed subsequently, since the first fill layer 113, the bottom fill layer 104 and the top fill layer 105 are etched by the second etch process at sequentially decreasing rates, the first fill layer 113 and the bottom fill layer 104 close to the sidewall of the capacitor contact hole 11 are etched more, and the top fill layer 105 and the bottom fill layer 104 close to a central axis of the first gap 14 are etched less, so as to help reduce a difference in distances between positions on a top surface of the subsequently-formed capacitor contact plug and the substrate 100 to obtain the capacitor contact plug with a relatively flat top morphology.

Figure 6:
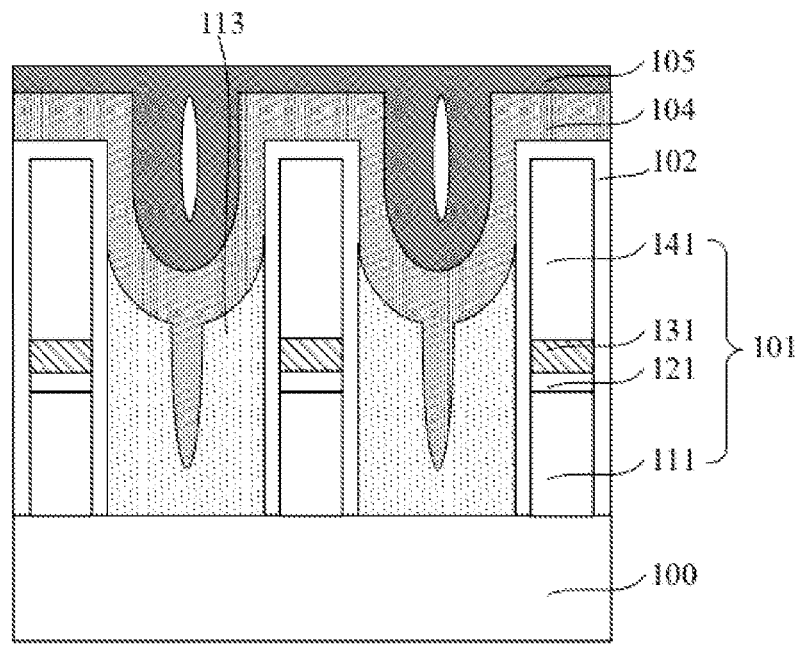
FIG. 6 is a sixth schematic diagram of cross-sectional structures corresponding to steps of the semiconductor structure manufacturing method according to the first embodiment of the present disclosure.
Figure 7:
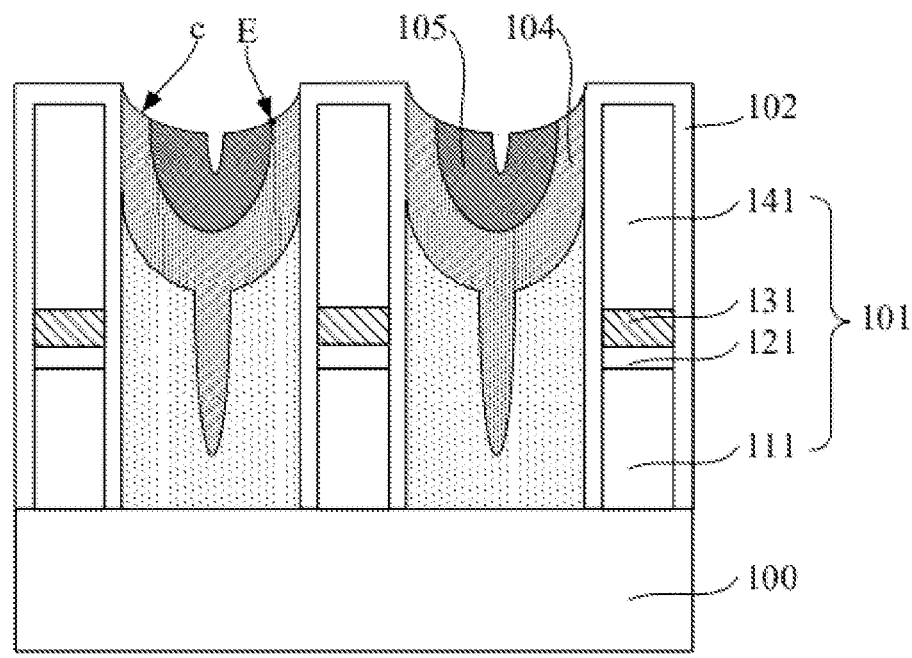
FIG. 7 is a seventh schematic diagram of cross-sectional structures corresponding to steps of the semiconductor structure manufacturing method according to the first embodiment of the present disclosure.

Referring to FIG. 5 to FIG. 7, the base fill layer is further located at a top of the bit line 101; and subsequent to the step of sequentially stacking at least two base fill layers on a surface of the first fill layer 113 and prior to the step of etching the first fill layer 113 and at least part of the base fill layers by using a second etch process, the method further includes: etching the base fill layer by using a third etch process to expose the insulation layer 102 located at the top of the bit line 101.

In addition, in this embodiment, referring to FIG. 6, prior to the step of etching the base fill layer by using the third etch process, the method further includes: planarizing the base fill layer, the remaining base fill layer being located at the top of the bit line 101.

Specifically, the second groove 17 is provided at the position where the surface of the top fill layer 105 corresponds to the central axis of the concave hole 15 when the top fill layer 105 is formed by using a deposition process, the top fill layer 105 is planarized to remove the second groove 17, so that the surface of the remaining top fill layer 105 is relatively flat. Referring to FIG. 7, when the base fill layer is etched subsequently by using the third etch process to expose the top of the bit line 101, it is conducive to enabling a top surface c jointly formed by the remaining top fill layer 105 and the remaining bottom fill layer 104 to be relatively flat, that is, reducing a difference in distances between positions on the top surface c and the substrate 100.

In other embodiments, the top fill layer 105 may not be planarized, and the top fill layer 105 and the bottom fill layer 104 are etched directly by using the third etch process to expose the top of the bit line 101, and a difference in the doping concentrations of the doping elements in the top fill layer 105 and the bottom fill layer 104 are adjusted to obtain a final capacitor contact plug with a relatively flat top morphology.

In this embodiment, the remaining top fill layer 105 and the remaining bottom fill layer 104 are etched by using the third etch process to expose the insulation layer 102 located at the top of the bit line 101. The insulation layer 102 located at the top of the bit line 101 is an etch stop point. In other embodiments, when the insulation layer 102 located at the top of the bit line 101 is removed, an etch stop point of the third etch process is located at the top of the bit line 101.

Due to a process error caused by the deposition process, in a direction perpendicular to the surface of the substrate 100, the first fill layer 113 and the base fill layer formed on different substrates 100 vary in thickness; that is, the first fill layer 113 and the base fill layer above the top of the bit line 101 on each substrate 100 have a different total thickness. However, the bit line 101 formed on each substrate 100 and the insulation layer 102 located on the bit line 101 are strictly specified to be the same in thickness. Therefore, when the insulation layer 102 located at the top of the bit line 101 is taken as an etch stop point in the third etch process, the remaining bottom fill layer 104 and the remaining top fill layer 105 on each substrate 100 can have a same total thickness. Therefore, when the second etch process is performed subsequently, a capacitor contact plug with a relatively flat top morphology can be obtained in different substrates 100 by controlling the etch time to be the same.

In addition, in other embodiments, both the top fill layer 105 and the bottom fill layer 104 may be planarized, as long as it can be ensured that the remaining bottom fill layer 104 is located at the top of the bit line 101, so that the insulation layer 102 located at the top of the bit line 101 or the top of the bit line 101 can act as an etch stop point when the third etch process is performed.

Figure 9:
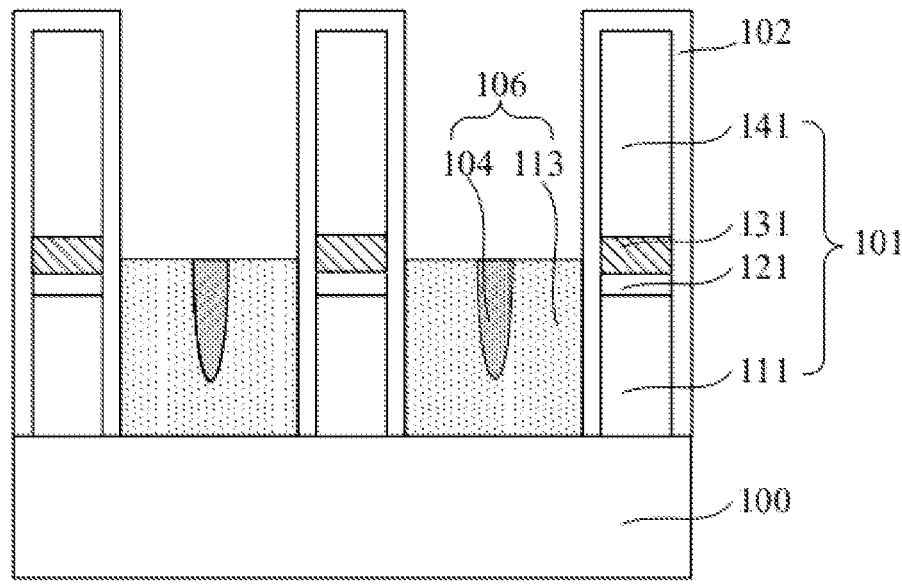
FIG. 9 is a ninth schematic diagram of cross-sectional structures corresponding to steps of the semiconductor structure manufacturing method according to the first embodiment of the present disclosure.

Referring to FIG. 7 and FIG. 9, in the process of etching the first fill layer 113 and at least part of the base fill layers by using the second etch process, the second gap 16 (refer to FIG. 5) is removed, which helps ensure that the subsequently-formed capacitor contact plug has no void, so as to help ensure good conductivity of the capacitor contact plug.

Specifically, in this embodiment, the first fill layer 113, the remaining top fill layer 105 and the remaining bottom fill layer 104 are etched by using the second etch process. In other embodiments, after the top fill layer 105 is formed, the first fill layer 113, the top fill layer 105 and the bottom fill layer 104 may be etched directly by using the second etch process.

Further, in the direction perpendicular to the substrate 100 and pointing to the bit line 101 along the substrate 100, the base fill layers are etched by the second etch process at layer-by-layer decreasing rates; that is, the remaining bottom fill layer 104 is etched by the second etch process at a rate greater than the remaining top fill layer 105. In addition, in this embodiment, the third etch process and the second etch process have same process parameters. In other embodiments, the third etch process and the second etch process may have different process parameters.

Figure 8:
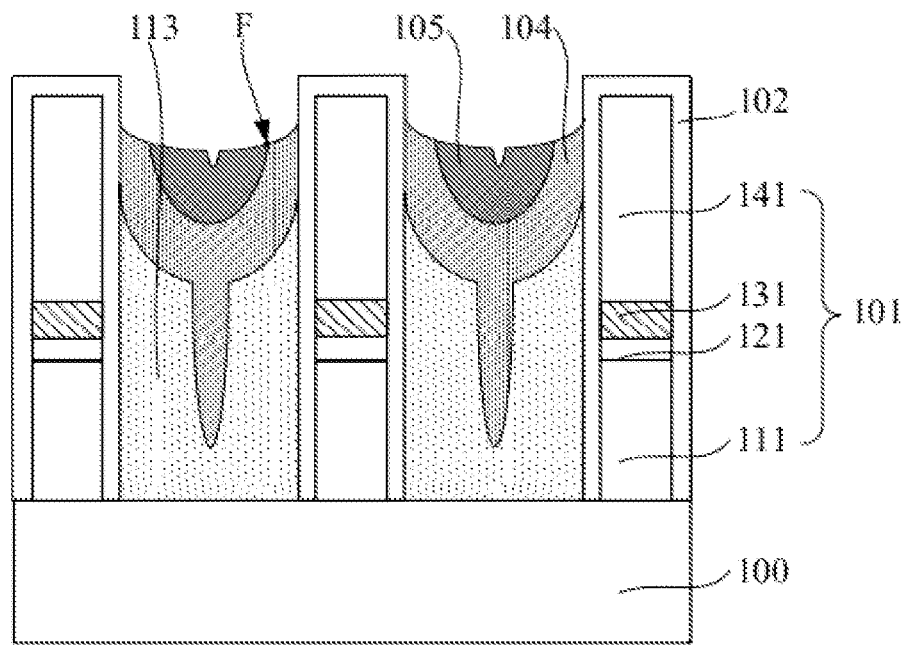
FIG. 8 is an eighth schematic diagram of cross-sectional structures corresponding to steps of the semiconductor structure manufacturing method according to the first embodiment of the present disclosure.

Still referring to FIG. 7 to FIG. 9, in this embodiment, in the process of etching the first fill layer 113, the remaining top fill layer 105 and the remaining bottom fill layer 104 by using the second etch process, an etch curved surface may be formed in the capacitor contact hole 11 (refer to FIG. 1). A slope at each point of the etch curved surface gradually increases in a direction parallel to the substrate 100 and pointing to the sidewall of the capacitor contact hole 11 along the gap region 12 (refer to FIG. 2).

Specifically, the etch curved surface is a surface of an etch material in the second etch process in contact with the first fill layer 113 and at least part of the base fill layers. Since the base fill layers are etched by the second etch process at layer-by-layer decreasing rates in the direction perpendicular to the substrate 100 and pointing to the bit line 101 along the substrate 100, with the progress of the second etch process, the gradual increase in the slope at each point of the etch curved surface slows down in the direction parallel to the substrate 100 and pointing to the sidewall of the capacitor contact hole 11 along the gap region 12, which helps finally obtain a capacitor contact plug 106 with a relatively flat top morphology.

Various embodiments of the present disclosure can have one or more the following advantages.

In the above technical solutions, a fill film is formed in the capacitor contact hole, and the fill film is etched by using a first etch process to form a first fill layer; then, at least two base fill layers are formed on a surface of the first fill layer, and the base fill layer fills a first gap in the first fill layer, which helps prevent a void in a subsequently-formed capacitor contact plug and prevent the reduction of the conductivity of the capacitor contact plug. Further, the first fill layer is provided with the first gap, the first fill layer has a top surface connecting the first gap and a sidewall of the capacitor contact hole, and in a direction parallel to the substrate and pointing to the sidewall of the capacitor contact hole along the first gap, a distance between the top surface and the substrate gradually increases; on this basis, in a direction perpendicular to the substrate and pointing to the bit line along the substrate, the doping concentration of the base fill layer is decreased layer by layer.

As such, when the first fill layer and at least part of the base fill layers are subsequently etched, the base fill layer close to the sidewall of the capacitor contact hole is etched more and the base fill layer close to a middle region of the capacitor contact hole is etched less within a same etch time. Therefore, the capacitor contact plug finally formed can have a relatively flat top morphology by controlling a difference in doping concentrations between adjacent base fill layers, which helps reduce contact resistance between the capacitor contact plug and other conductive structures and helps improve the yield of the semiconductor structure.

Moreover, the first fill layer is located only at a bottom and a partial sidewall of the capacitor contact hole, so an opening of the first gap in the first fill layer away from the substrate has a larger size, which helps subsequent filling of the first gap with the base fill layer; and the base fill layer located in the first gap has no void, which helps ensure that the subsequently-formed capacitor contact plug has no void, so as to ensure the good conductivity of the capacitor contact plug.

Further, referring to an etch moment shown in FIG. 7, Point E is a junction point of the remaining bottom fill layer 104 and the remaining top fill layer 105 on the etch curved surface at this moment. Referring to an etch moment shown in FIG. 8, Point F is a junction point of the remaining bottom fill layer 104 and the remaining top fill layer 105 on the etch curved surface at this moment. It is to be noted that, Point E and Point F are points corresponding to similar positions at different etch moments on the etch curved surface. Referring to FIG. 7 and FIG. 8, it can be seen that the slope of Point F is less than that of Point E, and the gradual increase in the slope of each point on the etch curved surface slows down with the progress of the second etch process.

In this embodiment, the first fill layer 113, the remaining top fill layer 105 and at least part of the remaining bottom fill layer 104 are etched by using the second etch process with a purpose of forming the capacitor contact plug 106 in the capacitor contact hole 11.

Specifically, the remaining first fill layer 113 and the remaining bottom fill layer 104 jointly form the capacitor contact plug 106. In addition, a top surface of the capacitor contact plug 106 away from the substrate 100 is parallel to the surface of the substrate 100, which facilitates the subsequent formation of other conductive structures on the capacitor contact plug 106, helps reduce contact resistance between the capacitor contact plug 106 and other conductive structures, and helps improve the yield of the semiconductor structure. In other embodiments, by adjusting the difference between the doping concentrations of the doping elements in the bottom fill layer 104 and the top fill layer 105, the capacitor contact plug 106 may also be composed of the remaining first fill layer 113 alone; or the capacitor contact plug 106 may also be composed of the remaining first fill layer 113, the remaining bottom fill layer 104 and the remaining top fill layer 105 together.

Further, in the direction perpendicular to the surface of the substrate 100, a ratio of a thickness of the capacitor contact plug 106 to a height of the bit line 101 ranges from 10% to 80%. In one example, the ratio of the thickness of the capacitor contact plug 106 to the height of the bit line 101 is 30%.

In this embodiment, the doping concentrations of the doping elements in the first fill layer 113, the bottom fill layer 104 and the top fill layer 105 are controlled to be decreased layer by layer, so that, when the capacitor contact plug 106 is formed subsequently through an etch process, the capacitor contact plug 106 with a relatively flat top morphology and no internal void can be obtained, so as to help improve the conductivity of the capacitor contact plug 106 and reduce the contact resistance between the capacitor contact plug 106 and other conductive structures, thereby helping improve the yield of the semiconductor structure.

A second embodiment of the present disclosure further provides a semiconductor structure manufacturing method. The embodiment is substantially the same as the foregoing embodiment, and their main difference lies in different numbers of layers of the base fill layer formed. The semiconductor structure manufacturing method according to the second embodiment of the present disclosure is described in detail below with reference to FIG. 5. It is to be noted that the contents identical to or corresponding to those in the foregoing embodiment may be obtained with reference to the detail description in the foregoing embodiment, which are not described in detail herein.

FIG. 10 to FIG. 13 are schematic diagrams of cross-sectional structures corresponding to steps of a semiconductor structure manufacturing method according to the present embodiment.

Figure 10:
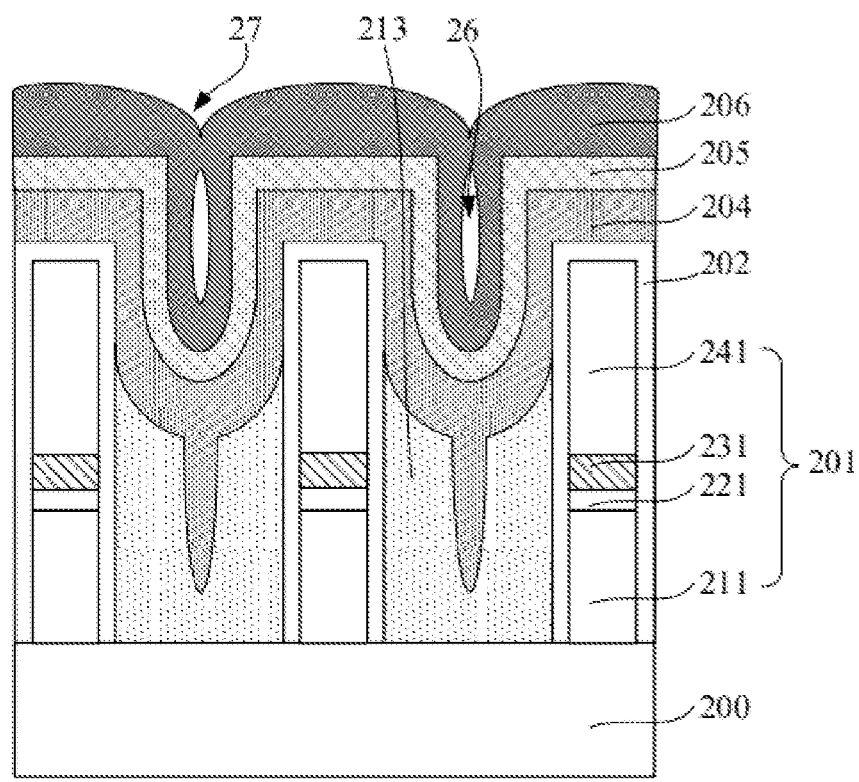
FIG. 10 is a schematic diagram of cross-sectional structures corresponding to steps of the semiconductor structure manufacturing method according to a second embodiment of the present disclosure.

Referring to FIG. 10, three base fill layers are sequentially stacked on a surface of the first fill layer 113, and the base fill layer farthest from the substrate 100 fills the remaining capacitor contact hole 11.

Specifically, in a direction perpendicular to a substrate 200 and pointing to a bit line 201 along the substrate 200, the three base fill layers are sequentially a bottom fill layer 204, a middle fill layer 205 and a top fill layer 206. Doping concentrations of doping elements in the bottom fill layer 204, the middle fill layer 205 and the top fill layer 206 are decreased layer by layer. Therefore, in this embodiment, when the three base fill layers are formed by using a deposition process, during the deposition, a gas with the doping element is introduced, and a gas flow of the gas configured to form the base fill layer is decreased layer by layer in the direction perpendicular to the substrate 200 and pointing to the bit line 201 along the substrate 200.

In this embodiment, the bottom fill layer 204 located in the capacitor contact hole 11 defines a first concave hole, part of the middle fill layer 205 is located in the first concave hole, and the middle fill layer 205 located in the first concave hole defines a second concave hole. The top fill layer 206 fills the second concave hole, the top fill layer 206 is provided with a second gap 26, and a second groove 27 is further provided at a position where a surface of the top fill layer 206 corresponds to a central axis of the second gap 26.

The bottom fill layer 204, the middle fill layer 205 and the top fill layer 206 are formed by a process of chemical vapor deposition or atomic layer deposition.

Figure 13:
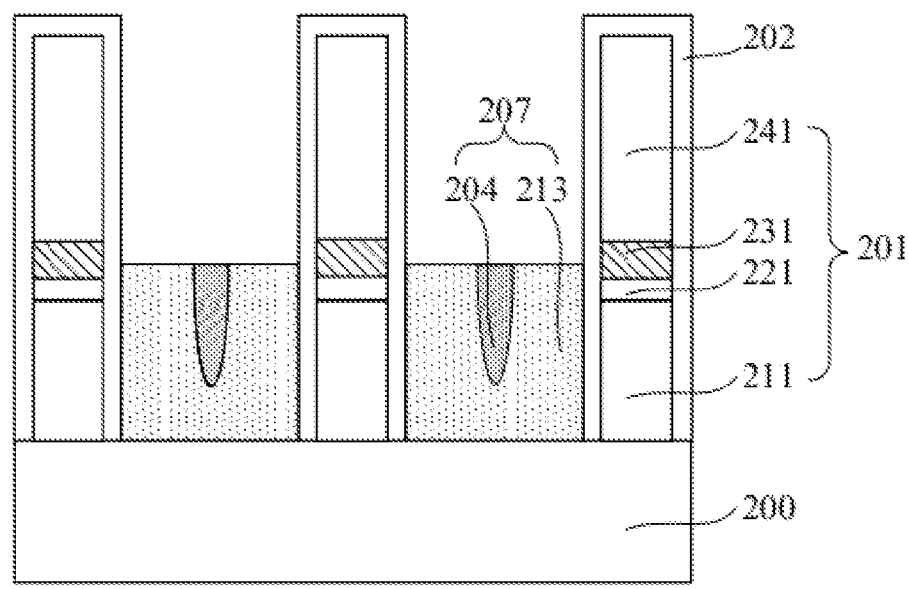
FIG. 13 is a third schematic diagram of cross-sectional structures corresponding to steps of the semiconductor structure manufacturing method according to a second embodiment of the present disclosure.

Referring to FIG. 10 and FIG. 13, in the process of etching the first fill layer 213 and at least part of the base fill layers by using a second etch process, the second gap 26 is removed, which helps ensure that a subsequently-formed capacitor contact plug 207 has no void, so as to help ensure good conductivity of the capacitor contact plug 207.

Figure 11:
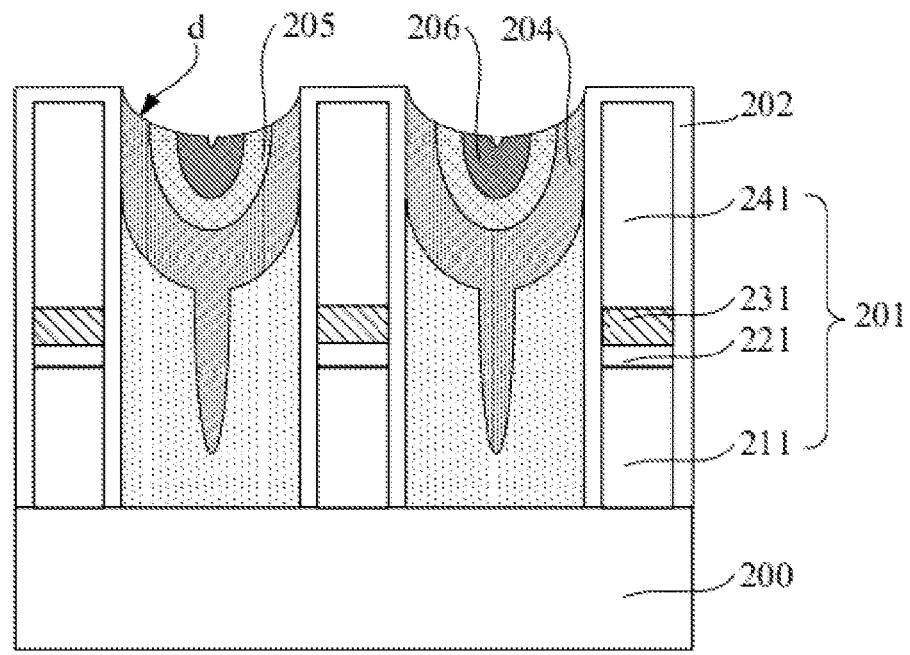
FIG. 11 is a first schematic diagram of cross-sectional structures corresponding to steps of the semiconductor structure manufacturing method according to a second embodiment of the present disclosure.
Figure 12:
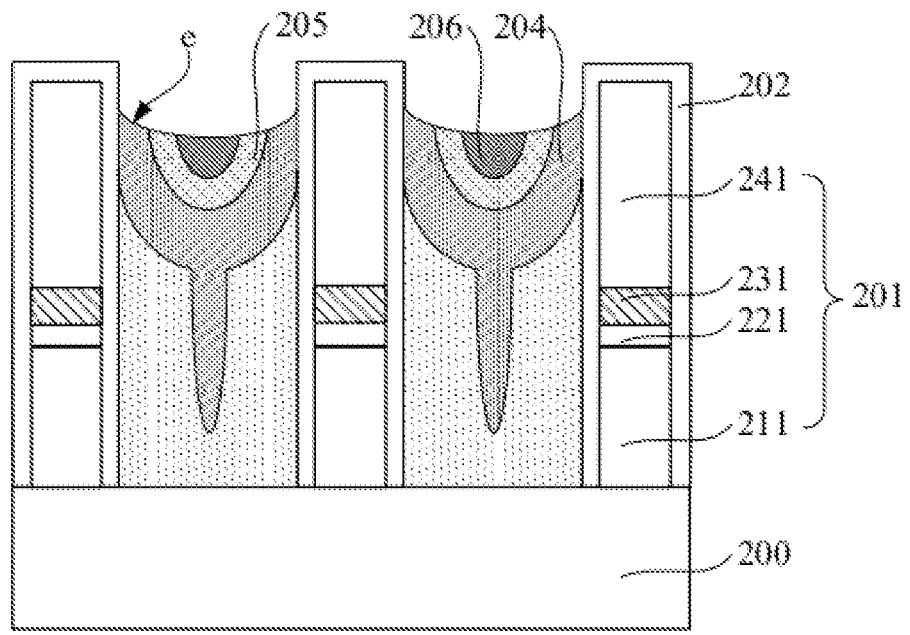
FIG. 12 is a second schematic diagram of cross-sectional structures corresponding to steps of the semiconductor structure manufacturing method according to a second embodiment of the present disclosure.

Referring to FIG. 11, when the corresponding second etch process is performed to a first moment, the remaining bottom fill layer 204, the remaining middle fill layer 205 and the remaining top fill layer 206 jointly form a first top surface d in this case. Referring to FIG. 12, when the corresponding second etch process is performed to a second moment, the remaining bottom fill layer 204, the remaining middle fill layer 205 and the remaining top fill layer 206 jointly form a second top surface e in this case. Referring to FIG. 11 and FIG. 12, the first top surface d is recessed more than the second top surface e.

Thus, an etch curved surface may be formed in the capacitor contact hole in the process of etching the first fill layer 213, the bottom fill layer 204, the middle fill layer 205 and the top fill layer 206 by using the second etch process. Specifically, the etch curved surface is a surface of an etch material in the second etch process in contact with the first fill layer 213 and at least part of the base fill layers. Since the base fill layers are etched by the second etch process at layer-by-layer decreasing rates in the direction perpendicular to the substrate 200 and pointing to the bit line 201 along the substrate 200, with the progress of the second etch process, the gradual increase in the slope at each point of the etch curved surface slows down in a direction parallel to the substrate 200 and pointing to the sidewall of the capacitor contact hole along the first gap, which helps finally obtain a capacitor contact plug 207 with a relatively flat top morphology.

Referring to FIG. 13, the remaining first fill layer 213 and the remaining bottom fill layer 204 jointly form the capacitor contact plug 207. In addition, a top surface of the capacitor contact plug 207 away from the substrate 200 is parallel to the surface of the substrate 200, which facilitates the subsequent formation of other conductive structures on the capacitor contact plug 207, helps reduce contact resistance between the capacitor contact plug 207 and other conductive structures, and helps improve the yield of a semiconductor structure.

In other embodiments, by adjusting the difference between the doping concentrations of the doping elements in the bottom fill layer 204, the middle fill layer 205 and the top fill layer 206, the capacitor contact plug 207 may also be composed of the remaining first fill layer 213 alone; or the capacitor contact plug 207 may also be composed of the remaining first fill layer 213, the remaining bottom fill layer 204 and the remaining middle fill layer 205 together; or the capacitor contact plug 207 may also be composed of the remaining first fill layer 213, the remaining bottom fill layer 204, the remaining middle fill layer 205 and the remaining top fill layer 206 together.

Correspondingly, a third embodiment of the present disclosure further provides a semiconductor structure. The semiconductor structure is manufactured with the semiconductor structure manufacturing method according to any one of the above embodiments.

Referring to FIG. 9, the semiconductor structure includes: a substrate 100, the substrate 100 having a plurality of discrete bit lines 101, and a capacitor contact hole being provided between adjacent bit lines 101; and a capacitor contact plug 106, the capacitor contact plug 106 being located at a bottom of the capacitor contact hole, and the capacitor contact plug 106 being composed of a first fill layer 113 and a base fill layer. In this embodiment, the base fill layer is the bottom fill layer 104 in the above embodiment. In other embodiments, the base fill layer may also be of a laminated structure of at least two layers.

Specifically, a top surface of the first fill layer 113 has a hole, and the bottom fill layer 104 fills the hole on the top surface of the first fill layer 113, which helps ensure that the capacitor contact plug 106 has no void; and the capacitor contact plug 106 has a relatively flat top morphology. In other embodiments, the capacitor contact plug 106 may be composed of the first fill layer 113 alone.

Further, a top surface of the capacitor contact plug 106 away from the substrate 100 is parallel to a surface of the substrate 100, which facilitates the subsequent formation of other conductive structures on the capacitor contact plug 106, helps reduce contact resistance between the capacitor contact plug 106 and other conductive structures, and helps improve the yield of the semiconductor structure.

In addition, both the first fill layer 113 and the bottom fill layer 104 are silicon material layers with doping elements, and a doping concentration of the doping element in the first fill layer 113 is greater than that of the doping element in the bottom fill layer 104.

Those of ordinary skill in the art may understand that the above implementations are specific embodiments for implementing the present disclosure. However, in practical applications, various changes in forms and details may be made thereto without departing from the spirit and scope of the present disclosure.

Any person skilled in the art can make respective changes and modifications without departing from the spirit and scope of the present disclosure. Therefore, the protection scope of the present disclosure should be subject to the scope defined by the claims.

What is claimed is:

1. A semiconductor structure manufacturing method, comprising:
   providing a substrate, the substrate having a plurality of discrete bit lines, and a capacitor contact hole being provided between adjacent bit lines;
   forming a fill film filling the capacitor contact hole, the fill film being provided with a gap region;
   etching the fill film by using a first etch process to open the gap region, the remaining fill film acting as a first fill layer, the remaining gap region acting as a first gap located in the first fill layer, the first fill layer having a top surface connecting the first gap and a sidewall of the capacitor contact hole, and in a direction pointing to the sidewall of the capacitor contact hole along the first gap, a distance between the top surface and the substrate gradually increasing;
   sequentially stacking at least two base fill layers on a surface of the first fill layer, the base fill layer farthest from the substrate filling the remaining capacitor contact hole;

decreasing a doping concentration of the base fill layer, layer by layer, in a direction perpendicular to the substrate and pointing to the bit line along the substrate; and etching the first fill layer and at least part of the base fill layers by using a second etch process to form a capacitor contact plug.

2. The semiconductor structure manufacturing method according to claim 1, wherein a top surface of the capacitor contact plug away from the substrate is parallel to a surface of the substrate.

3. The semiconductor structure manufacturing method according to claim 1, wherein the first fill layer is located only at a bottom and a partial sidewall of the capacitor contact hole.

4. The semiconductor structure manufacturing method according to claim 1, wherein the process step of sequentially stacking at least two base fill layers on a surface of the first fill layer comprises: forming a bottom fill layer, the bottom fill layer filling the first gap, and the bottom fill layer located in the capacitor contact hole defining a concave hole; and forming a top fill layer, the top fill layer filling the concave hole, and the top fill layer being provided with a second gap.

5. The semiconductor structure manufacturing method according to claim 1, wherein the base fill layer is a silicon material layer with a doping element, and a difference between doping concentrations of the doping elements in adjacent base fill layers is not greater than 200 atom/cm$^3$.

6. The semiconductor structure manufacturing method according to claim 1, wherein the base fill layer is formed by using a deposition process, and during the deposition, a gas with the doping element is introduced, and a gas flow of the gas configured to form the base fill layer is decreased layer by layer in the direction perpendicular to the substrate and pointing to the bit line along the substrate.

7. The semiconductor structure manufacturing method according to claim 4, wherein in the process of etching the first fill layer and at least part of the base fill layers by using a second etch process, the second gap is removed.

8. The semiconductor structure manufacturing method according to claim 7, wherein in the process of etching the first fill layer and at least part of the base fill layers by using a second etch process, the base fill layers are etched by the second etch process at layer-by-layer decreasing rates in the direction perpendicular to the substrate and pointing to the bit line along the substrate.

9. The semiconductor structure manufacturing method according to claim 8, wherein the first fill layer, the top fill layer and at least part of the base fill layers are etched by using the second etch process to form the capacitor contact plug.

10. The semiconductor structure manufacturing method according to claim 1, wherein the base fill layer is further located at a top of the bit line; and subsequent to the step of sequentially stacking at least two base fill layers on a surface of the first fill layer and prior to the step of etching the first fill layer and at least part of the base fill layers by using a second etch process, the method further comprises:

etching the base fill layer by using a third etch process to expose the top of the bit line.

11. The semiconductor structure manufacturing method according to claim 10, prior to the step of etching the base fill layer by using a third etch process, further comprising:

planarizing the base fill layer, the remaining base fill layer being located at the top of the bit line.

12. The semiconductor structure manufacturing method according to claim 1, wherein the first fill layer is a silicon material layer with a doping element, and a doping concentration of the doping element in the first fill layer is greater than that of the doping element in the base fill layer.

13. The semiconductor structure manufacturing method according to claim 12, wherein the fill film and the base fill layer are formed by using a deposition process, and during the deposition, a gas with the doping element is introduced, a gas flow of the gas configured to form the fill film is a first gas flow, a gas flow of the gas configured to form the base fill layer is a second gas flow, and the first gas flow is greater than the second gas flow.

* * * * *